United States Patent
Bachu et al.

(10) Patent No.: US 8,340,004 B2
(45) Date of Patent: Dec. 25, 2012

(54) COMBINING TRANSMISSION WITH INCREMENTING FIELDS

(75) Inventors: Raja Sekhar Bachu, Somerset, NJ (US); Ashwin Sampath, Skillman, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 353 days.

(21) Appl. No.: 12/756,101

(22) Filed: Apr. 7, 2010

(65) Prior Publication Data
US 2011/0249600 A1    Oct. 13, 2011

(51) Int. Cl.
- *H04L 5/14* (2006.01)
- *H04J 3/00* (2006.01)
- *H04B 7/216* (2006.01)
- *H04B 7/212* (2006.01)

(52) U.S. Cl. ......... 370/294; 370/280; 370/441; 370/442

(58) Field of Classification Search ................... None
See application file for complete search history.

(56) References Cited

U.S. PATENT DOCUMENTS

| | | |
|---|---|---|
| 2006/0045169 A1 | 3/2006 | Kim |
| 2008/0227449 A1 | 9/2008 | Gholmieh et al. |
| 2008/0316995 A1 | 12/2008 | Bachu et al. |
| 2009/0046713 A1 | 2/2009 | Teague et al. |
| 2009/0067378 A1 | 3/2009 | Luo et al. |
| 2009/0154392 A1 | 6/2009 | Park et al. |
| 2009/0158109 A1 | 6/2009 | Park et al. |
| 2009/0158110 A1 | 6/2009 | Park et al. |
| 2009/0177951 A1* | 7/2009 | Lee et al. .................... 714/799 |
| 2009/0180435 A1 | 7/2009 | Sarkar |

FOREIGN PATENT DOCUMENTS

| | | |
|---|---|---|
| EP | 1811711 A1 | 7/2007 |
| WO | 2008157686 A1 | 12/2008 |

OTHER PUBLICATIONS

Motorola, "P-BCH Design", 3GPP DRAFT; R1-072665; Orlando, USA; Jun. 25-29, 2007.*
International Search Report and Written Opinion—PCT/US2011/031613, ISA/EPO—Jun. 27, 2011.
Lucas R et al., "Improved Soft-Decision Decoding of Reed-Muller Codes as Generalized Multiple Concatenated Codes", ITG Fachberichte, VDE Verlag, Berlin, DE, No. 146, Mar. 5, 1998, pp. 137-142, XP008032848, ISSN: 0932-6022.
Motorola: "P-BCH Design", 3GPP DRAFT; R1-072665—P-BCH, 3rd Generation Partnership Project (3GPP), Mobile Competence Centre ; 650, Route Des Lucioles ; F-06921 Sophia-Antipolis Cedex ; France, vol. RAN WGI, no. Orlando, USA; 20070620, Jun. 20, 2007, XP050106362, [retrieved on Jun. 20, 2007].

(Continued)

*Primary Examiner* — Clemence Han
(74) *Attorney, Agent, or Firm* — Kenneth Vu

(57) ABSTRACT

Chase combining gains for receiving a scrambled broadcast channel can be achieved even when a portion of each received channel coded transmission contains a portion that varies. A set of possible difference values for this varying portion, such as for a system frame number, provides hypotheses, each having a corresponding probability. One or more of the hypotheses are selected by rank order for adjusting a corresponding received coded transmission so that two or more channel coded transmissions can be combined and blind decoded until one of the hypotheses are confirmed.

44 Claims, 8 Drawing Sheets

OTHER PUBLICATIONS

Texas Instruments Inc: "P-BCH content and structure in E-UTRA", 3GPP DRAFT; R2-070701_P-BCH Content and Structure in E-UTRA, 3rd Generation Partnership Project (3GPP), Mobile Competence Centre; 650, Route Des Lucioles; F-06921 Sophia-Antipolis Cedex; France, vol. RAN WG2, no. St. Louis, USA; 20070209, Feb. 9, 2007, XP050133736, [retrieved on Feb. 9, 2007].

3GPP—3rd Generation Partnership Project. "Technical Specification Group Radio Access Network; Evolved Universal Terrestrial Radio Access (E-UTRA); LTE Physical Layer—General Description (Release 8)." 3GPP TS 36.201 V8.3.0 (Mar. 2009). Published online at [http://www.quintillion.co.jp/3GPP/Specs/36201-830.pdf], retrieved Aug. 28, 2009.

3GPP—3rd Generation Partnership Project. "Technical Specification Group Radio Access Network; Evolved Universal Terrestrial Radio Access (E-UTRA); Physical Channels and Modulation (Release 8)." 3GPP TS 36.211 V8.7.0 (May 2009). Published online at [http://mailgroup.jp/3GPP/Specs/36211-870.pdf], retrieved Aug. 28, 2009.

3GPP—3rd Generation Partnership Project. "Technical Specification Group Radio Access Network; Evolved Universal Terrestrial Radio Access (E-UTRA); Multiplexing and channel coding (Release 8)." 3GPP TS 36.212 V8.7.0 (May 2009). Published online at [http://www.3gpp.org/ftp/Specs/archive/36_series/36.212/], retrieved Aug. 28, 2009.

3GPP—3rd Generation Partnership Project. "Technical Specification Group Radio Access Network; Evolved Universal Terrestrial Radio Access (E-UTRA); Physical layer procedures (Release 8)." 3GPP TS 36.213 V8.7.0 (May 2009). Published online at [http://mailgroup.jp/3GPP/Specs/36213-870.pdf], retrieved Aug. 28, 2009.

3GPP—3rd Generation Partnership Project. "Technical Specification Group Radio Access Network; Evolved Universal Terrestrial Radio Access (E-UTRA); Physical layer—Measurements (Release 8)." 3GPP TS 36.214 V8.6.0 (Mar. 2009). Published online at [http://www.quintillion.co.jp/3GPP/Specs/36214-860.pdf], retrieved on Aug. 28, 2009.

3GPP—3rd Generation Partnership Project. "Technical Specification Group Radio Access Network; Evolved Universal Terrestrial Radio Access (E-UTRA); Services provided by the physical layer (Release 8)." 3GPP TS 36.302 V8.2.0 (Jun. 2009). Published online at [http://mailgroup.jp/3GPP/Specs/36302-820.pdf], retrieved Aug. 28, 2009.

* cited by examiner

COMBINING TRANSMISSION WITH INCREMENTING FIELDS

BACKGROUND

1. Field

The present disclosure relates generally to communication, and more specifically to decoding a broadcast control channel in a wireless communication network.

2. Background

The 3rd Generation Partnership Project (3GPP) Long Term Evolution (LTE) represents a major advance in cellular technology and is the next step forward in cellular 3G services as a natural evolution of the Global System for Mobile Communications (GSM) and Universal Mobile Telecommunications System (UMTS). LTE provides for an uplink speed of up to 50 megabits per second (Mbps) and a downlink speed of up to 100 Mbps and brings many technical benefits to cellular networks. LTE is designed to meet carrier needs for high-speed data and media transport as well as high-capacity voice support well into the next decade. Bandwidth is scalable from 1.25 MHz to 20 MHz. This suits the needs of different network operators that have different bandwidth allocations, and also allows operators to provide different services based on spectrum. LTE is also expected to improve spectral efficiency in 3G networks, allowing carriers to provide more data and voice services over a given bandwidth. LTE encompasses high-speed data, multimedia unicast and multimedia broadcast services.

The LTE physical layer (PHY) is a highly efficient means of conveying both data and control information between an enhanced base station (eNodeB) and mobile user equipment (UE). The LTE PHY employs some advanced technologies that are new to cellular applications. These include Orthogonal Frequency Division Multiplexing (OFDM) and Multiple Input Multiple Output (MIMO) data transmission. In addition, the LTE PHY uses Orthogonal Frequency Division Multiple Access (OFDMA) on the downlink (DL) and Single Carrier—Frequency Division Multiple Access (SC-FDMA) on the uplink (UL). OFDMA allows data to be directed to or from multiple users on a resource block basis for a specified number of symbol periods.

Recently, LTE Advanced is an evolving mobile communication standard for providing 4G services. Being defined as 3G technology, LTE does not meet the requirements for 4G, also called IMT Advanced as defined by the International Telecommunication Union, such as peak data rates up to 1 Gbit/s. Besides the peak data rate, LTE Advanced also targets faster switching between power states and improved performance at the cell edge.

To facilitate communication with remote terminals in a mobile networking arrangement, network base stations broadcast wireless signals that include synchronization and/or acquisition signals. The signals vary from one system to another (e.g., an LTE system can utilize a primary synchronization channel (PSC) and secondary synchronization channel (SSC), whereas an Ultra Mobile Broadband (UMB) system can utilize TDM1, TDM2, and TDM3 acquisition pilots), but typically include data that facilitates various functions pertinent to mobile communications. Examples of such functions include identifying a base station broadcasting a wireless signal and a type of system associated with the base station (e.g., LTE, UMB, etc.), providing initial timing and/or frequency data for demodulating the signal, conveying initial system parameters concerning the system (e.g., whether synchronous or asynchronous, what Time Division Duplex (TDD) partitioning is used), and so on. In addition, wireless signals comprise control channels that provide configuration information utilized by remote terminals to register on the mobile network and communicate with the network. Paging services, utilized to notify a terminal of an inbound call, are one example of functions performed with control channel information in some systems.

Control channel and pilot information are often provided in the dedicated resources (e.g., time, frequency) of a wireless signal. This provides an advantage in that receiving devices can reliably analyze predetermined resources to obtain demodulation and synchronization data concerning the wireless signal. One drawback, however, is that additional resources might not be available for other information pertinent to initial acquisition or signal synchronization. For instance, where a standard governing a mobile system provides specific resources for pilot and control information, the signal might have limited capacity to accommodate advancements in the network architecture after the standard is established. Thus, for instance, where a system evolves to have multiple acquisition/control states, transmission states, or the like, not envisioned by the standard, it can be difficult to convey system state information.

One particular problem is illustrated by blind decoding. When a mobile device first enters a macro network, system and/or channel information from the network may be necessary in order to communicate with the network. However, if the mobile device is not already acclimated with the network, some of the information might have to be decoded blindly, or without specific instruction on how to decode a channel or where system information exists within a received signal. One mechanism for blind decoding is to analyze the received signal according to multiple known states. Where a particular known state is well correlated with analyzed signals, it can be assumed that the particular state corresponds with the signal. However, this assumption can lead to false alarms, where multiple states sufficiently correlate to the analyzed signal. Multiple correlations can occur, for instance, where low signal to noise (SNR) is prevalent.

Recently, it has been recognized that communicating broadcast control information multiple times can increase the likelihood of successfully receiving the information. Instances where the transmission remains static, gain can be realized by combining the multiple transmissions before decoding. This approach has generally been referred to as Chase Combining In order to extend instances where such a gain can be realized, a linear channel coding approach has been described that addresses a variant portion of the transmission that increments by one between subsequent transmissions. To summarize, let $i_0$ and $i_1$ be first and second transmissions with the corresponding codewords being $c_0$ and $c_1$, where the linear channel coding can be represented as:

$$c_0 = f(i_0)$$

$$c_1 = f(i_1)$$

If $i_1 = i_0 + e$, $$c_1 = f(i_1) = f(i_0 + e)$$

$$c_1 = f(i_0) = f(e)$$

$$c_1 = c_0 + f(e)$$

If e is known, and hence f(e) is known, then $c_1$ can be modified to an equivalent $c_0$ codeword and decoded after combining with the first transmission.

In particular, this technique requires negating a predictable difference between transmissions before combining. Unfortunately, it is not always possible to accurately predict a difference between transmissions. A difference in channel coded transmissions can be one of a set of values that prevents realizing a combining gain.

SUMMARY

The following presents a simplified summary in order to provide a basic understanding of some aspects of the disclosed aspects. This summary is not an extensive overview and is intended to neither identify key or critical elements nor delineate the scope of such aspects. Its purpose is to present some concepts of the described features in a simplified form as a prelude to the more detailed description that is presented later.

In one aspect, a method is provided for decoding a channel coded transmission by employing a processor executing computer executable instructions stored on a computer readable storage medium to implement following acts: A first transmission code is received containing a first sequence portion. A second transmission code is received containing a second sequence portion. A set of possible difference values is determined for the difference between the first sequence portion and the second sequence portion as a plurality of hypotheses. Note that, "difference" here implies difference operation in the underlying field used for generating the linear code. A corresponding probability is determined for each of the set of possible difference values. The first transmission code and the second transmission code are combined wherein one is adjusted according to a selected difference from the set of possible difference values based upon having the higher probability. Blind decoding is performed for the result of combining the adjusted first and second transmission codes.

In another aspect, a computer program product is provided for decoding a channel coded transmission. At least one computer readable storage medium stores computer executable instructions that, when executed by at least one processor, implement components: A first set of codes receives a first transmission code containing a first sequence portion. A second set of codes receives a second transmission code containing a second sequence portion. A third set of codes determines a set of possible difference values for a difference between the first sequence portion and the second sequence portions as a plurality of hypotheses. Note that, "difference" here implies difference operation in the underlying field used for generating the linear code. A fourth set of codes determines a corresponding probability for each of the plurality of hypotheses. A fifth set of codes combines the first transmission code and the second transmission code that are adjusted according to a selected difference from the set of possible difference values based upon having a higher probability to create a result. A sixth set of codes performs blind decoding, the result of combining the adjusted first and second transmission codes.

In an additional aspect, an apparatus is provided for decoding a channel coded transmission: At least one computer readable storage medium stores computer executable instructions that, when executed by at least one processor, implement components: Means are provided for receiving a first transmission code containing a first sequence portion. Means are provided for receiving a second transmission code containing a second sequence portion. Means are provided for determining a set of possible difference values for a difference between the first sequence portion and the second sequence portions as a plurality of hypotheses. Note that, "difference" here implies difference operation in the underlying field used for generating the linear code. Means are provided for determining a corresponding probability for each of the plurality of hypotheses. Means are provided for combining the first transmission code and the second transmission code that are adjusted according to a selected difference from the set of possible difference values based upon having a higher probability to create a result. Means are provided for performing blind decoding of the result of combining the adjusted first and second transmission codes.

In a further aspect, an apparatus is provided for decoding a channel coded transmission. A receiver receives a first transmission code containing a first sequence portion and receives a second transmission code containing a second sequence portion. A computing platform determines a set of possible difference values for the difference between the first sequence portion and the second sequence portion as a plurality of hypotheses, determines a corresponding probability for each of the plurality of hypotheses, and combines the first transmission code and the second transmission code that are adjusted according to a selected difference from the set of possible difference values based upon having a higher probability to create a result. A demodulator performs blind decoding of the result of combining the adjusted first and second transmission codes.

To the accomplishment of the foregoing and related ends, one or more aspects comprise the features hereinafter fully described and particularly pointed out in the claims. The following description and the annexed drawings set forth in detail certain illustrative aspects and are indicative of but a few of the various ways in which the principles of the aspects may be employed. Other advantages and novel features will become apparent from the following detailed description when considered in conjunction with the drawings and the disclosed aspects are intended to include all such aspects and their equivalents.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout, and wherein.

DETAILED DESCRIPTION

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

Figure 1:
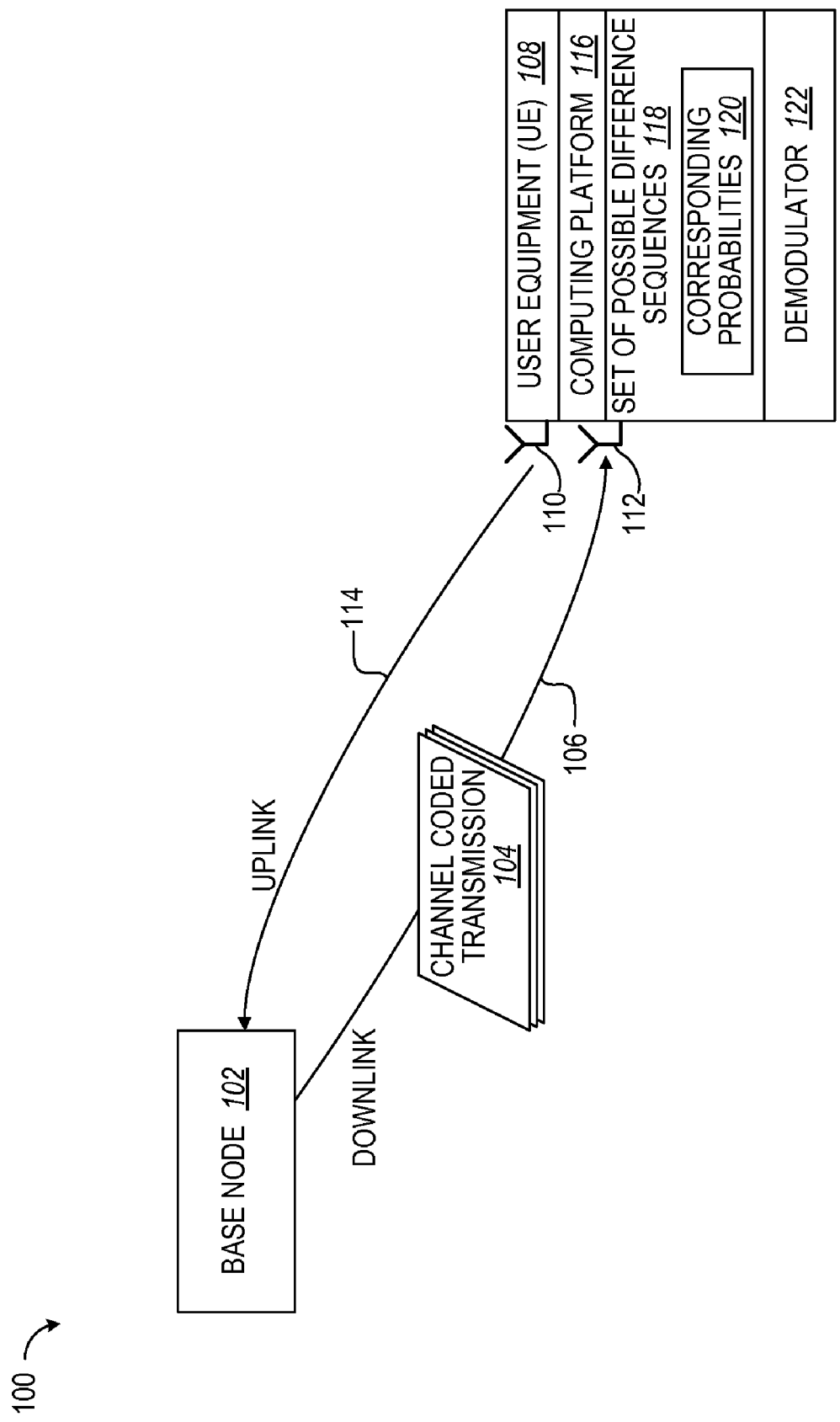
FIG. 1 illustrates a block diagram of a communication system for receiving a physical broadcast channel with chase combining gain.

In FIG. 1, a wireless communication system 100 includes a base node 102 that transmits a sequence of channel coded transmissions 104 on a downlink 106 to user equipment (UE) 108. Included in the downlink 106 is a broadcast control channel, such as a Physical Broadcast Channel (PBCH), that the UE 108 acquires with a receiver 110 in order to gain system information sufficient to perform a Random Access Channel (RACH) procedure by transmitting with a transmitter 112 on an uplink 114 to gain service.

In particular, the receiver 110 receives a plurality of transmission codes, each containing a sequence portion. A computing platform 116 determines a set of possible difference values 118 for the difference of sequences as a plurality of hypotheses, determines a corresponding probability 120 for each of the set of possible difference values 118, and combines the transmission codes adjusted according to a selected difference from the set of possible difference values based upon having a higher probability 120. A demodulator 122 performs blind decoding the result of combining the adjusted first and second transmission codes.

Figure 2:
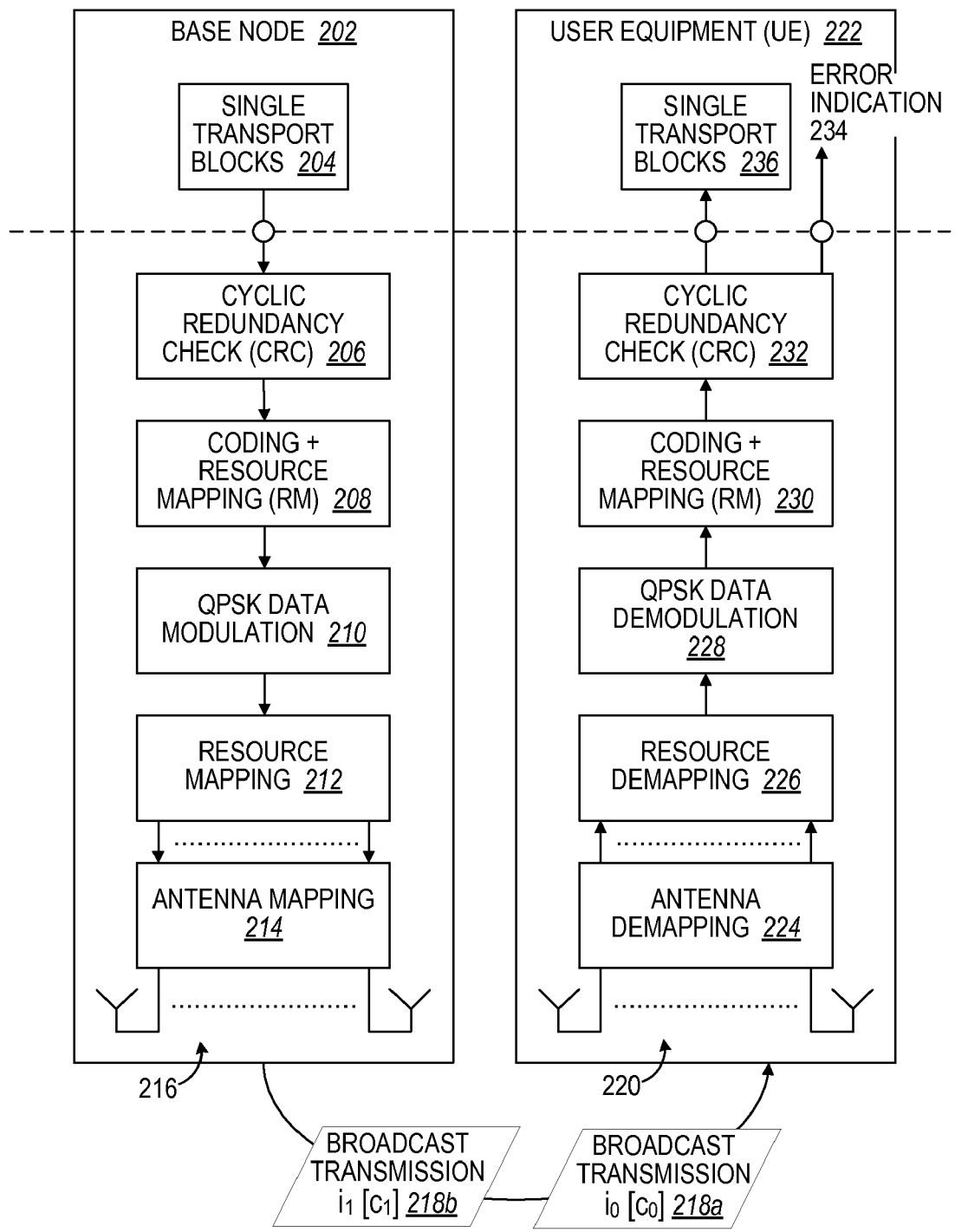
FIG. 2 illustrates a diagram for a physical-layer model for broadcast channel transmission and receiving.

In an illustrative application for receiving a Broadcast Channel (BCH), in FIG. 2 a physical-layer model 200 for BCH transmission is characterized by a fixed pre-defined transport format. The repetition rate, e.g., Transmit Time Interval (TTI), of the BCH is 40 ms. The BCH physical-layer model 200 is described based on the corresponding BCH physical-layer-processing chain on a base node 202 by single transport blocks 204 being processed by a Cyclic Redundancy Check (CRC) component 206, to a coding and Resource Mapping (RM) component 208, a Quadrature Phase Shift Keying (QPSK)-only data modulation component 210, a resource mapping component 212, to an antenna mapping component 214, for transmitting over antennas 216. A Physical Broadcast Channel (PBCH) is received as a series of coded transmissions, each containing a sequence portion 218a, 218b for being received on antennas 220 of UE 222. The received signal passes through antenna demapping component 224, to a resource demapping component 226, through data demodulation component 228, through coding and resource mapping component 230, and through CRC component 232 that provides an error indication 234 whether decoded single transport blocks 236 were accurately received.

Forward Error Correction (FEC) and rate matching is supported with a channel coding rate implicitly given by the combination of transport block size, modulation scheme and resource assignment. No BCH Hybrid Automatic Repeat reQuest (HARD) is used (i.e., no higher-layer control of redundancy version). Data modulation is provided with a fixed modulation scheme (QPSK) (i.e. not higher-layer control). Mapping to a physical resource is performed with fixed pre-determined transport format and resource allocation (i.e. no higher-layer control). Multi-antenna processing is provided with fixed pre-determined processing, i.e. no higher-layer control.

Figure 3:
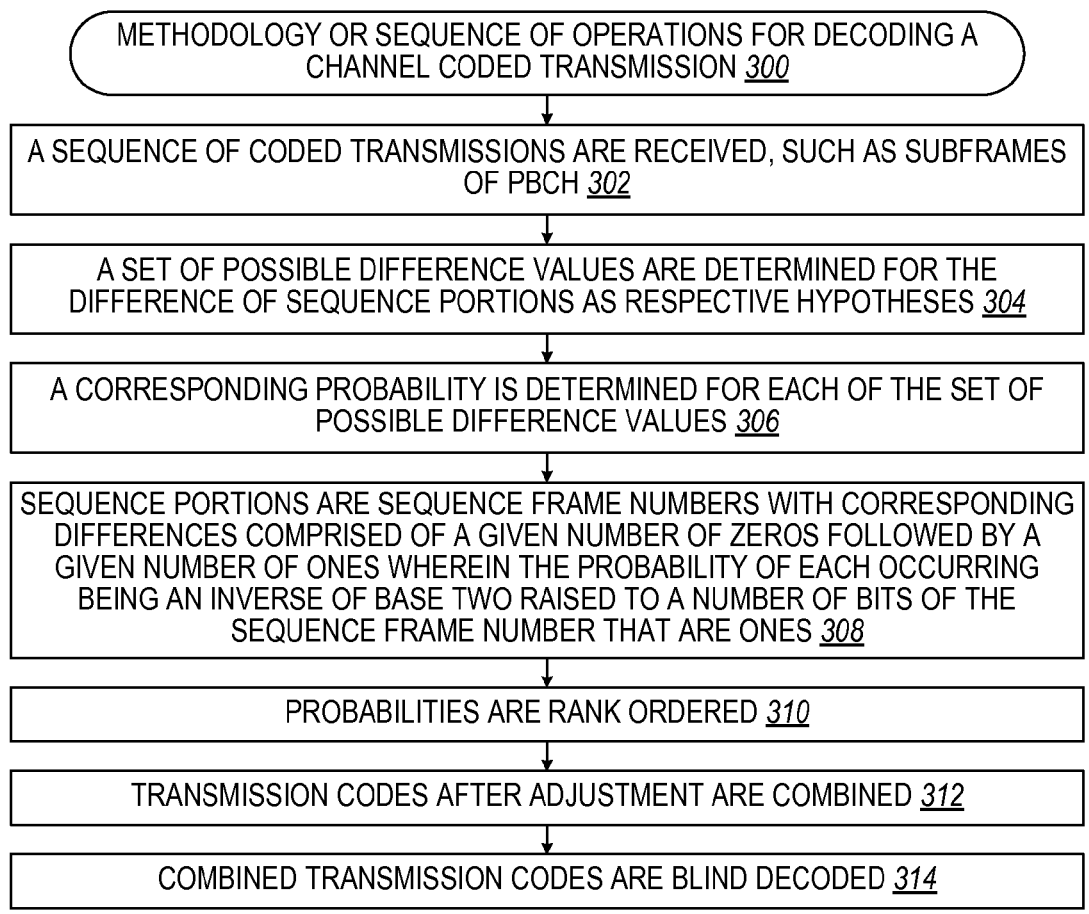
FIG. 3 illustrates a methodology for decoding a channel coded transmission.

In FIG. 3, a methodology or sequence of operations 300 is provided for decoding a channel coded transmission. A sequence of coded transmissions is received, such as subframes of a Physical Broadcast Channel (PBCH) (block 302). This can entail receiving a first transmission code containing a first sequence portion and a second transmission code containing a second sequence portion. In some instances, more than two transmission codes are processed for obtaining a Chase combining gain by receiving a second transmission code. A set of possible difference values for the difference between the first sequence portion and the second sequence portion are determined as a plurality of hypotheses (block 304). The set of values is more than one possible hypothesis and the difference between the first sequence portion and the second sequence portion can be more than one between sequence portions. A corresponding probability is determined for each of the set of possible difference values (block 306). In an exemplary aspect, the sequence portions are system frame numbers with the corresponding differences comprised of a given number of zeros followed by a given number of ones wherein the corresponding probability of each occurring being an inverse of base two raised to a number of bits of the selected one of the plurality of hypotheses that are ones (block 308). The probabilities are rank ordered (block 310). The transmission codes after adjustment for difference are combined (block 312). The combined transmission codes are blind decoded (block 314).

While decoding a broadcast channel on a downlink has been described, it should be appreciated with the benefit of the present disclosure that aspects can apply to an uplink channel as well as other types of downlink channels.

A wireless multiple-access communication system may simultaneously support communication for multiple wireless access terminals. As mentioned above, each terminal may communicate with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-in-single-out ("SISO") system, a multiple-in-multiple-out ("MIMO") system, or some other type of system.

Figure 4:
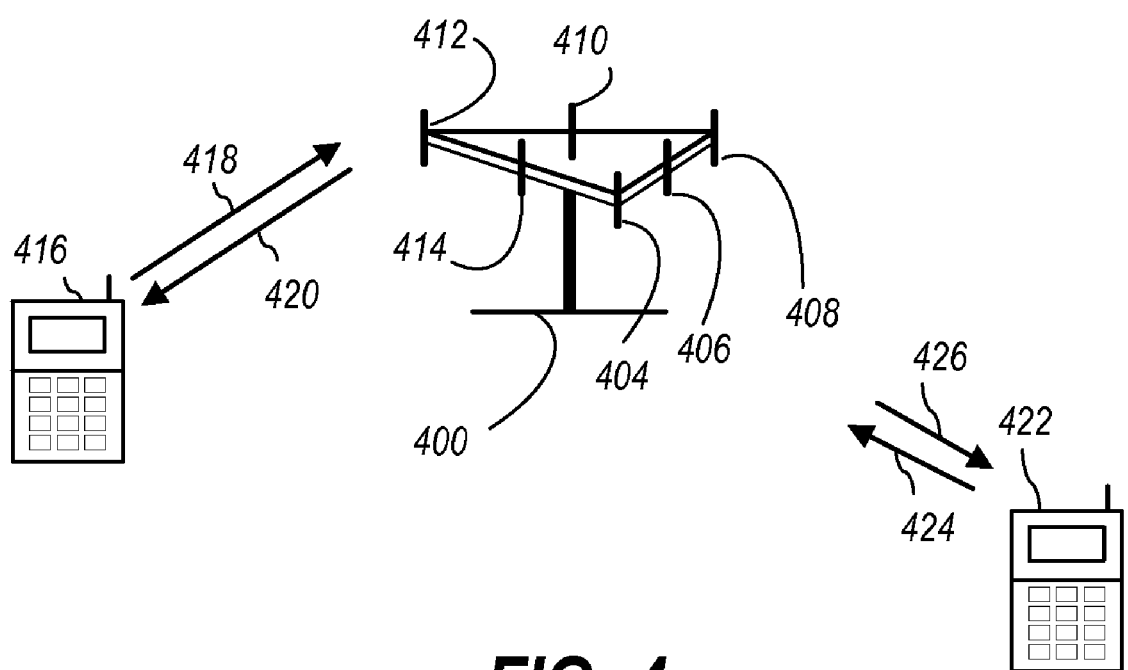
FIG. 4 illustrates a diagram of a multiple access wireless communication system.

Referring to FIG. 4, a multiple access wireless communication system according to one aspect is illustrated. An access point (AP) 400 includes multiple antenna groups, one including 404 and 406, another including 408 and 410, and an additional including 412 and 414. In FIG. 4, only two antennas are shown for each antenna group, however, more or fewer antennas may be utilized for each antenna group. Access terminal (AT) 416 is in communication with antennas 412 and 414, where antennas 412 and 414 transmit information to access terminal 416 over forward link 420 and receive information from access terminal 416 over reverse link 418. Access terminal 422 is in communication with antennas 406 and 408, where antennas 406 and 408 transmit information to access terminal 422 over forward link 426 and receive information from access terminal 422 over reverse link 424. In a FDD system, communication links 418, 420, 424 and 426 may use different frequencies for communication. For example, forward link 420 may use a different frequency then that used by reverse link 418.

Each group of antennas and/or the area in which they are designed to communicate is often referred to as a sector of the access point. In the aspect, antenna groups each are designed to communicate to access terminals in a sector, of the areas covered by access point 400.

In communication over forward links 420 and 426, the transmitting antennas of access point 400 utilize beamforming in order to improve the signal-to-noise ratio of the forward links for the different access terminals 416 and 422. Also, an access point using beamforming to transmit to access terminals scattered randomly through its coverage causes less interference to access terminals in neighboring cells than an access point transmitting through a single antenna to all of its access terminals.

An access point may be a fixed station used for communicating with the terminals and may also be referred to as an access point, a Node B, or some other terminology. An access terminal may also be called user equipment (UE), a wireless communication device, terminal, or some other terminology.

A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels, which are also referred to as spatial channels, where $N_S \leq \min\{N_T, N_R\}$. Each of the $N_S$ independent channels corresponds to a dimension. The MIMO system may provide improved performance (e.g., higher throughput and/or greater reliability) if the additional dimensionalities created by the multiple transmit and receive antennas are utilized.

A MIMO system may support time division duplex ("TDD") and frequency division duplex ("FDD"). In a TDD system, the forward and reverse link transmissions are on the same frequency region so that the reciprocity principle allows the estimation of the forward link channel from the reverse link channel. This enables the access point to extract transmit beam-forming gain on the forward link when multiple antennas are available at the access point.

Figure 5:
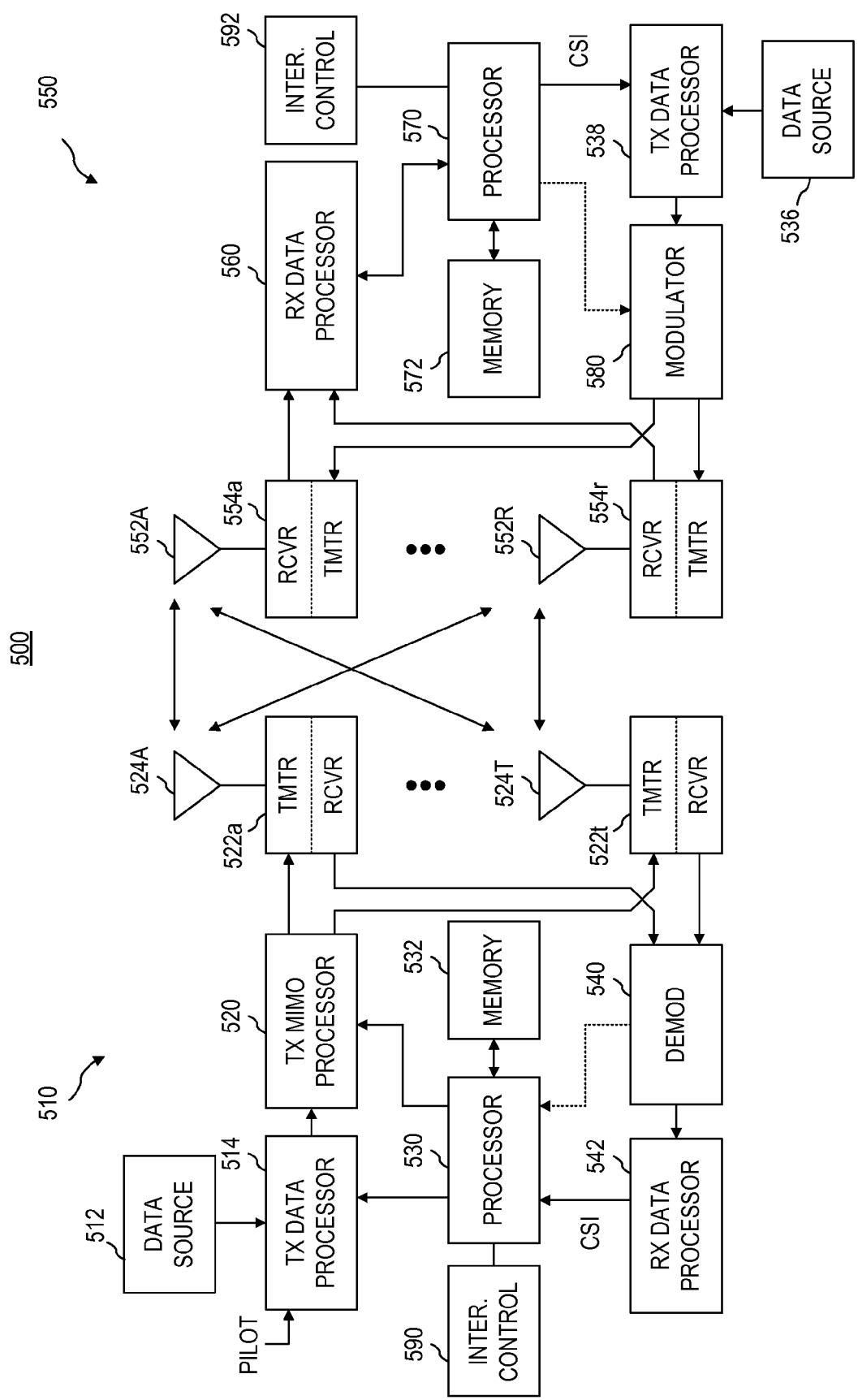
FIG. 5 illustrates a schematic of a multiple input multiple output (MIMO) communication system.

The teachings herein may be incorporated into a node (e.g., a device) employing various components for communicating with at least one other node. FIG. 5 depicts several sample components that may be employed to facilitate communication between nodes. Specifically, FIG. 5 illustrates a wireless device 510 (e.g., an access point) and a wireless device 550 (e.g., an access terminal) of a MIMO system 500. At the device 510, traffic data for a number of data streams is provided from a data source 512 to a transmit ("TX") data processor 514.

In some aspects, each data stream is transmitted over a respective transmit antenna. The TX data processor 514 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., Binary Phase Shift Keying (BPSK), Quadrature Phase-Shift Keying (QSPK), Multiple or M-ary Phase Shift Keying (M-PSK), or Multiple Quadrature Amplitude Modulation (M-QAM)) selected for that data stream to provide modulation symbols. The data rate, coding, and modulation for each data stream may be determined by instructions performed by a processor 530. A data memory 532 may store program code, data, and other information used by the processor 530 or other components of the device 510.

The modulation symbols for all data streams are then provided to a TX MIMO processor 520, which may further process the modulation symbols (e.g., for OFDM). The TX MIMO processor 520 then provides $N_T$ modulation symbol streams to $N_T$ transceivers ("XCVR") 522a through 522t that each has a transmitter (TMTR) and receiver (RCVR). In some aspects, the TX MIMO processor 520 applies beam-forming weights to the symbols of the data streams and to the antenna from which the symbol is being transmitted.

Each transceiver 522a-522t receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transceivers 522a through 522t are then transmitted from $N_T$ antennas 524a through 524t, respectively.

At the device 550, the transmitted modulated signals are received by $N_R$ antennas 552a through 552r and the received signal from each antenna 552a-552r is provided to a respective transceiver ("XCVR") 554a through 554r. Each transceiver 554a-554r conditions (e.g., filters, amplifies, and downconverts) a respective received signal, digitizes the conditioned signal to provide samples, and further processes the samples to provide a corresponding "received" symbol stream.

A receive ("RX") data processor 560 then receives and processes the $N_R$ received symbol streams from $N_R$ transceivers 554a-554r based on a particular receiver processing technique to provide $N_T$ "detected" symbol streams. The RX data processor 560 then demodulates, deinterleaves, and decodes each detected symbol stream to recover the traffic data for the data stream. The processing by the RX data processor 560 is complementary to that performed by the TX MIMO processor 520 and the TX data processor 514 at the device 510.

A processor 570 periodically determines which pre-coding matrix to use. The processor 570 formulates a reverse link message comprising a matrix index portion and a rank value portion. A data memory 572 may store program code, data, and other information used by the processor 570 or other components of the device 550.

The reverse link message may comprise various types of information regarding the communication link and/or the received data stream. The reverse link message is then processed by a TX data processor 538, which also receives traffic data for a number of data streams from a data source 536, modulated by a modulator 580, conditioned by the transceivers 554a through 554r, and transmitted back to the device 510.

At the device 510, the modulated signals from the device 550 are received by the antennas 524a-524t, conditioned by the transceivers 522a-522t, demodulated by a demodulator ("DEMOD") 540, and processed by a RX data processor 542 to extract the reverse link message transmitted by the device 550. The processor 530 then determines which pre-coding matrix to use for determining the beam-forming weights, and then processes the extracted message.

FIG. 5 also illustrates that the communication components may include one or more components that perform interference control operations. For example, an interference ("INTER.") control component 590 may cooperate with the processor 530 and/or other components of the device 510 to send/receive signals to/from another device (e.g., device 550). Similarly, an interference control component 592 may cooperate with the processor 570 and/or other components of the device 550 to send/receive signals to/from another device (e.g., device 510). It should be appreciated that for each device 510 and 550 the functionality of two or more of the described components may be provided by a single component. For example, a single processing component may provide the functionality of the interference control component 590 and the processor 530 and a single processing component may provide the functionality of the interference control component 592 and the processor 570.

Figure 6:
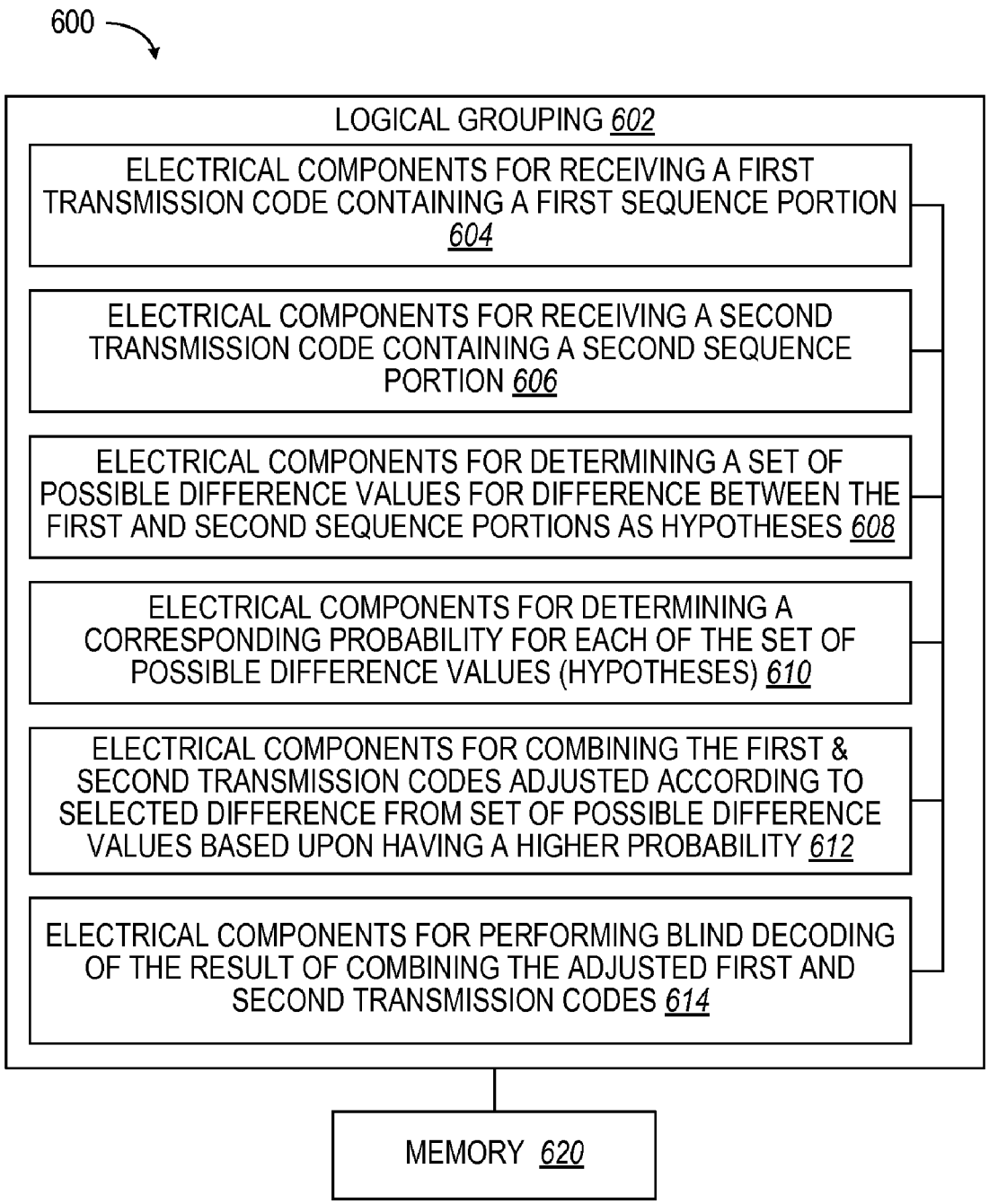
FIG. 6 illustrates a block diagram of a logical grouping of electrical components for decoding a channel coded transmission that is incorporated at least in part in user equipment.

With reference to FIG. 6, illustrated is a system 600 for decoding a channel coded transmission. For example, system 600 can reside at least partially within user equipment (UE). It is to be appreciated that system 600 is represented as including functional blocks, which can be functional blocks that represent functions implemented by a computing platform, processor, software, or combination thereof (e.g., firmware). System 600 includes a logical grouping 602 of electrical components that can act in conjunction. For instance, logical grouping 602 can include an electrical component for receiving a first transmission code containing a first sequence portion 604. Moreover, logical grouping 602 can include an electrical component for receiving a second transmission code containing a second sequence portion 606. Logical grouping 602 can include an electrical component for determining a set of possible difference values for the first sequence portion and the second sequence portion as respective hypotheses 608. Logical grouping 602 can include an electrical component for determining a corresponding probability for each of the plurality of hypotheses 610. Logical grouping 602 can include an electrical component for combining the first transmission code and the second transmission code adjusted for a selected one of the set of possible difference values based upon having the higher probability 612. Logical grouping 602 can include an electrical component for performing blind decoding of the adjusted and combined first and second transmission codes 614. Additionally, system 600 can include a memory 620 that retains instructions for executing functions associated with electrical components 604-614. While shown as being external to memory 620, it is to be understood that one or more of electrical components 604-614 can exist within memory 620.

Figure 7:
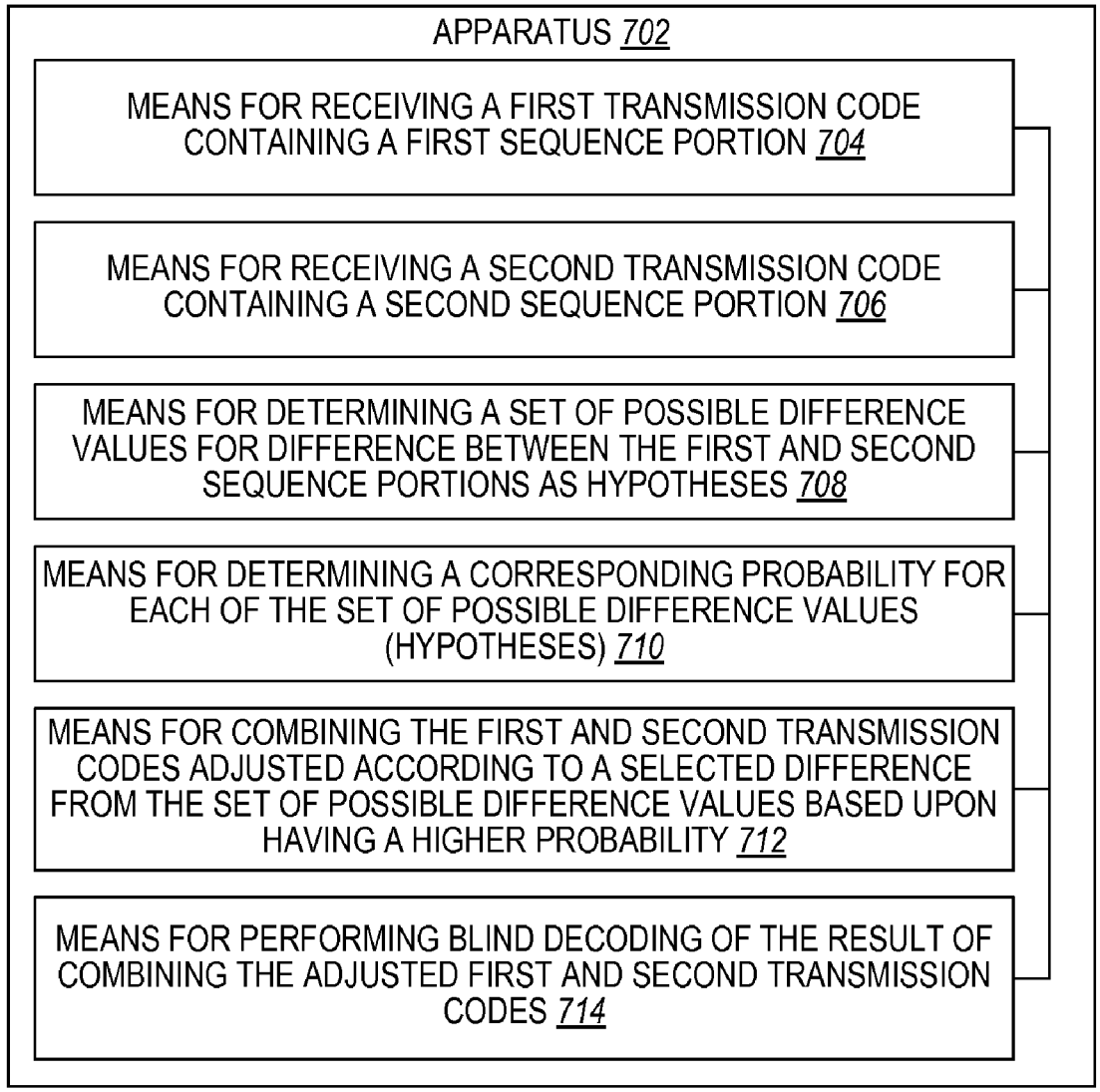
FIG. 7 illustrates a block diagram of an apparatus having means for decoding a channel coded transmission.

In FIG. 7, an apparatus 702 is depicted for decoding a channel coded transmission. Means 704 are provided for receiving a first transmission code containing a first sequence portion. Means 706 are provided for receiving a second transmission code containing a second sequence portion. Means 708 are provided for determining a set of possible difference values for the difference between the first sequence portion and the second sequence portion as a plurality of hypotheses. Means 710 are provided for determining a corresponding probability for each of the plurality of hypotheses. Means 712 are provided for combining the first transmission code and the second transmission code that are adjusted according to a selected difference from the set of possible difference values based upon having a higher probability to create a result. Means 714 are provided for performing blind decoding of the result after combining the adjusted first and second transmission codes.

Figure 8:
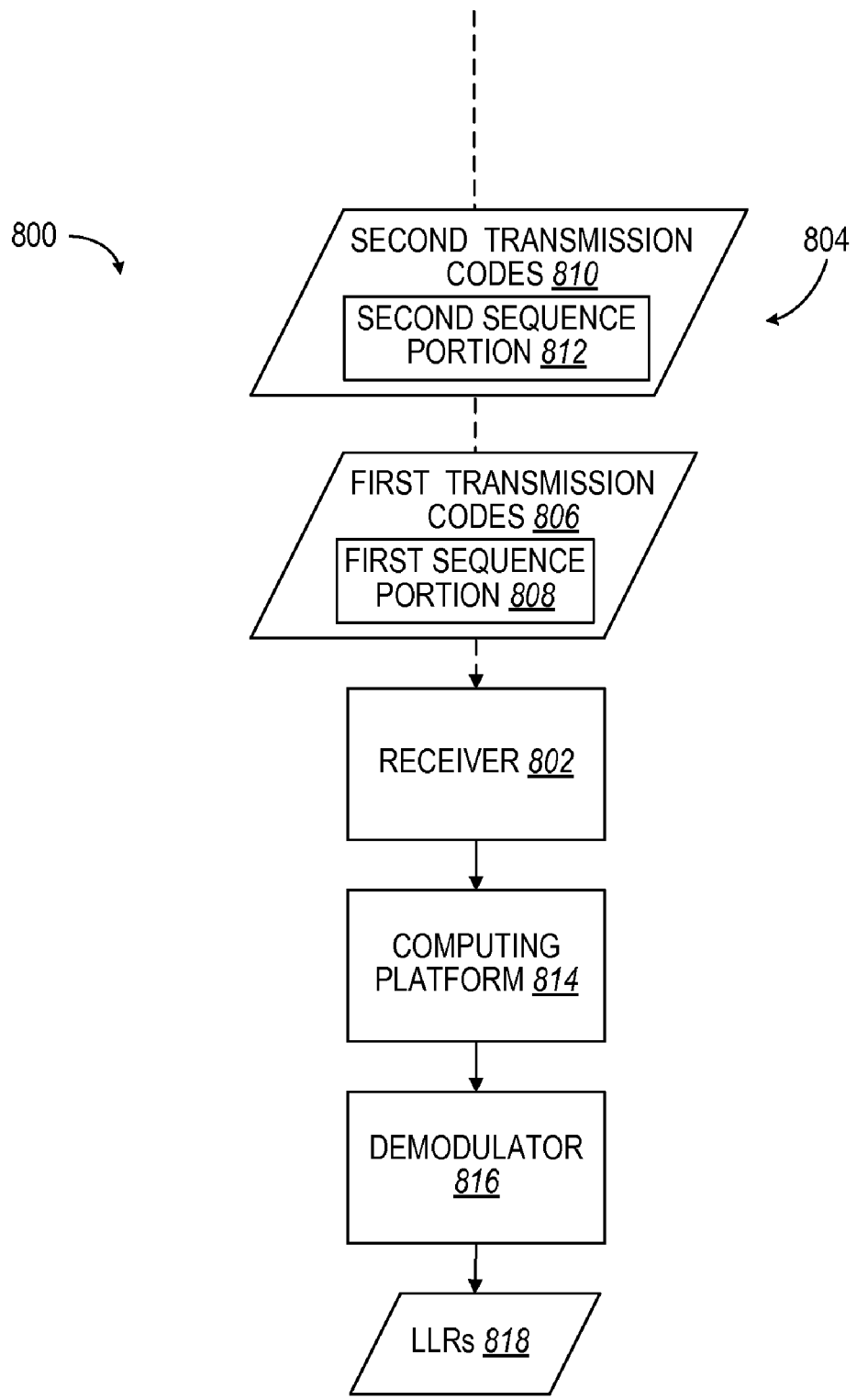
FIG. 8 illustrates a block diagram of a system for decoding a channel coded transmission.

In FIG. 8, a system 800 is provided for decoding a channel coded transmission. A receiver 802 receiving a sequence 804 of transmission codes, including a first transmission code 806 containing a first sequence portion 808 and for receiving a second transmission code 810 containing a second sequence portion 812. A computing platform 814 determines a set of possible difference values for a difference between the first sequence portion and the second sequence portions as a plurality of hypotheses, for determining a corresponding probability for each of the plurality of hypotheses, and for combining the first transmission code and the second transmission code that are adjusted according to a selected difference from the set of possible difference values based upon having a higher probability to create a result. A demodulator 816 performs blind decoding of the result after combining the adjusted first and second transmission codes, outputting a Log Likelihood Ratio (LLR) 818 that benefits from Chase Combining gain.

Those of skill would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

As used in this application, the terms "component", "module", "system", and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

The word "exemplary" is used herein to mean serving as an example, instance, or illustration. Any aspect or design described herein as "exemplary" is not necessarily to be construed as preferred or advantageous over other aspects or designs.

Various aspects will be presented in terms of systems that may include a number of components, modules, and the like. It is to be understood and appreciated that the various systems may include additional components, modules, etc. and/or may not include all of the components, modules, etc. discussed in connection with the figures. A combination of these approaches may also be used. The various aspects disclosed herein can be performed on electrical devices including devices that utilize touch screen display technologies and/or mouse-and-keyboard type interfaces. Examples of such devices include computers (desktop and mobile), smart phones, personal digital assistants (PDAs), and other electronic devices both wired and wireless.

In addition, the various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Furthermore, the one or more versions may be implemented as a method, apparatus, or article of manufacture using standard programming and/or engineering techniques to produce software, firmware, hardware, or any combination thereof to control a computer to implement the disclosed aspects. The term "article of manufacture" (or alternatively, "computer program product") as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope of the disclosed aspects.

The steps of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed aspects is provided to enable any person skilled in the art to make or use the present disclosure. Various modifications to these aspects will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

In view of the exemplary systems described supra, methodologies that may be implemented in accordance with the disclosed subject matter have been described with reference to several flow diagrams. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described herein. Additionally, it should be further appreciated that the methodologies disclosed herein are capable of being stored on an article of manufacture to facilitate transporting and transferring such methodologies to computers. The term article of manufacture, as used herein, is intended to encompass a computer program accessible from any computer-readable device, carrier, or media.

It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

What is claimed is:

1. A method for decoding a channel coded transmission, comprising:
    employing a processor executing computer executable instructions stored on a computer readable storage medium to implement following acts:
    receiving a first transmission code containing a first sequence portion;
    receiving a second transmission code containing a second sequence portion;
    determining a set of possible difference values for a difference between the first sequence portion and the second sequence portion as a plurality of hypotheses;
    determining a corresponding probability for each of the plurality of hypotheses;
    combining the first transmission code and the second transmission code that are adjusted according to a selected difference from the set of possible difference values based upon having a higher probability to create a result; and
    performing blind decoding of the result.

2. The method of claim 1, further comprising receiving a physical broadcast channel transmission across sub-frames.

3. The method of claim 1, wherein a selected one of the plurality of hypotheses comprises a given number of zeros followed by a given number of ones wherein the corresponding probability of each occurring having an inverse relationship to a function of base two raised to a number of bits of the selected one of the plurality of hypotheses that are ones.

4. The method of claim 1, further comprising:
    receiving a third transmission code containing a third sequence portion; and
    combining the first transmission code, the second transmission code, and a third transmission code by adjusting respectively for a selected difference from a set of possible difference values based upon having the higher probability.

5. The method of claim 1, further comprising adjusting for the selected one of the set of possible difference values based upon having the higher probability by rank ordering the plurality of hypotheses according to probability.

6. The method of claim 1, further comprising determining the set of possible difference values for the difference between the first sequence portion and the second sequence portion comprising a plurality of hypotheses.

7. The method of claim 6, further comprising determining the set of possible difference values for the difference between the first sequence portion and the second sequence portion comprising sequences that indicate the selected difference of at least one between the first sequence portion and the second sequence portion.

8. A computer program product for decoding a channel coded transmission, comprising:
    at least one non-transitory computer readable storage medium storing computer executable instructions that, when executed by at least one processor, implement components comprising:
    a first set of codes for receiving a first transmission code containing a first sequence portion;
    a second set of codes for receiving a second transmission code containing a second sequence portion;
    a third set of codes for determining a set of possible difference values for a difference between the first sequence portion and the second sequence portion as a plurality of hypotheses;
    a fourth set of codes for determining a corresponding probability for each of the plurality of hypotheses;

a fifth set of codes for combining the first transmission code and the second transmission code that are adjusted according to a selected difference from the set of possible difference values based upon having a higher probability to create a result; and a sixth set of codes for performing blind decoding of the result.

9. The computer program product of claim 8, further comprising a set of codes for receiving a physical broadcast channel transmission across sub-frames.

10. The computer program product of claim 8, wherein a selected one of the plurality of hypotheses comprises a given number of zeros followed by a given number of ones wherein the corresponding probability of each occurring having an inverse relationship to a function of base two raised to a number of bits of the selected one of the plurality of hypotheses that are ones.

11. The computer program product of claim 8, further comprising:
 a set of codes for receiving a third transmission code containing a third sequence portion; and
 a set of codes for combining the first transmission code, the second transmission code, and a third transmission code by adjusting respectively for a selected difference from a set of possible difference values based upon having the higher probability.

12. The computer program product of claim 8, further comprising a set of codes for adjusting for the selected one of the set of possible difference values based upon having the higher probability by rank ordering the plurality of hypotheses according to probability.

13. The computer program product of claim 8, further comprising a set of codes for determining the set of possible difference values for the difference between the first sequence portion and the second sequence portion comprises a plurality of hypotheses.

14. The computer program product of claim 13, further comprising a set of codes for determining the set of possible difference values for the difference between the first sequence portion and the second sequence portion comprising sequences that indicate the difference of at least one between the first sequence portion and the second sequence portion.

15. An apparatus for decoding a channel coded transmission, comprising:
 means for receiving a first transmission code containing a first sequence portion;
 means for receiving a second transmission code containing a second sequence portion;
 means for determining a set of possible difference values for a difference between the first sequence portion and the second sequence portion as a plurality of hypotheses;
 means for determining a corresponding probability for each of the plurality of hypotheses;
 means for combining the first transmission code and the second transmission code that are adjusted according to a selected difference from the set of possible difference values based upon having a higher probability to create a result; and
 means for performing blind decoding of the result.

16. The apparatus of claim 15, further comprising means for receiving a physical broadcast channel transmission across sub-frames.

17. The apparatus of claim 15, wherein a selected one of the plurality of hypotheses comprises a given number of zeros followed by a given number of ones wherein the corresponding probability of each occurring having an inverse relationship to a function of base two raised to a number of bits of the selected one of the plurality of hypotheses that are ones.

18. The apparatus of claim 15, further comprising:
 means for receiving a third transmission code containing a third sequence portion; and
 means for combining the first transmission code, the second transmission code, and the third transmission code by adjusting respectively for the selected difference from the set of possible difference values based upon having the higher probability.

19. The apparatus of claim 15, further comprising means for adjusting for the selected one of the set of possible difference values based upon having the higher probability by rank ordering the plurality of hypotheses according to probability.

20. The apparatus of claim 15, further comprising means for determining the set of possible difference values for the difference between the first sequence portion and the second sequence portion comprising a plurality of hypotheses.

21. The apparatus of claim 20, further comprising means for determining the set of possible difference values for the difference between the first sequence portion and the second sequence portion comprising sequences that indicate the difference of at least one between the first sequence portion and the second sequence portion.

22. An apparatus for decoding a channel coded transmission, comprising:
 a receiver for receiving a first transmission code containing a first sequence portion and for receiving a second transmission code containing a second sequence portion;
 a computing platform for determining a set of possible difference values for a difference between the first sequence portion and the second sequence portion as a plurality of hypotheses, for determining a corresponding probability for each of the plurality of hypotheses, and for combining the first transmission code and the second transmission code that are adjusted according to a selected difference from the set of possible difference values based upon having a higher probability to create a result; and
 a demodulator for performing blind decoding of the result.

23. The apparatus of claim 22, further comprising receiving physical broadcast channel transmission across sub-frames.

24. The apparatus of claim 22, wherein the computing platform is further for determining the plurality of hypotheses comprising a given number of zeros followed by a given number of ones wherein the corresponding probability of each occurring is a function of an inverse of base two raised to a number of bits of the selected one of the plurality of hypotheses that are ones.

25. The apparatus of claim 22, wherein the receiver is further for receiving a third transmission code containing a third sequence portion; and
 the computing platform is further for combining the first transmission code, the second transmission code, and a third transmission code by adjusting respectively for a selected difference from a set of possible difference values based upon having the higher probability.

26. The apparatus of claim 22, wherein the computing platform is further for adjusting for the selected one of the set of possible difference values based upon having the higher probability by rank ordering the plurality of hypotheses according to probability.

27. The apparatus of claim 22, wherein the computing platform is further for determining the set of possible difference values for the difference between the first sequence portion and the second sequence portion as a plurality of hypotheses.

28. The apparatus of claim 27, wherein the computing platform is further for determining the set of possible difference values for the difference between the first sequence portion and the second sequence portion comprising sequences that indicate the difference of at least one between the first sequence portion and the second sequence portion.

29. A method for decoding a channel coded transmission, comprising:
employing a processor executing computer executable instructions stored on a computer readable storage medium to implement following acts:
sequentially receiving a plurality of codes each comprising respectively a common portion and a unique portion;
determining a set of possible difference values for the unique portion respectively of the plurality of codes as a plurality of hypotheses, wherein each of the set of possible difference values comprises a given number of zeros followed by a given number of ones wherein the corresponding probability of each occurring having an inverse relationship to a function of base two raised to a number of bits of the selected one of the plurality of hypotheses that are ones;
adjusting the unique portion respectively of the plurality of codes according to a selected one of the plurality of hypotheses;
combining the plurality of codes as adjusted;
blind decoding the plurality of codes as combined; and
selecting another one of the plurality of hypotheses for testing in response to determining that the selected one of the plurality of hypotheses is incorrect.

30. The method of claim 29, further comprising:
determining a corresponding probability for each of the plurality of hypotheses; and
selecting one of the plurality of hypotheses in relation to probability.

31. The method of claim 30 further comprising rank ordering the plurality of hypotheses according to probability.

32. The method of claim 29, further comprising receiving a physical broadcast channel transmission across sub-frames.

33. A computer program product for decoding a channel coded transmission, comprising:
at least one non-transitory computer readable storage medium storing computer executable instructions that, when executed by at least one processor, implement components comprising:
a first set of codes for sequentially receiving a plurality of codes each comprising respectively a common portion and a unique portion;
a second set of codes for determining a set of possible difference values for the unique portion respectively of the plurality of codes as a plurality of hypotheses, wherein each of the set of possible difference values of comprises a given number of zeros followed by a given number of ones wherein the corresponding probability of each occurring having an inverse relationship to a function of base two raised to a number of bits of the selected one of the plurality of hypotheses that are ones;
a third set of codes for adjusting the unique portion respectively of the plurality of codes according to a selected one of the plurality of hypotheses;
a fourth set of codes for combining the plurality of codes as adjusted;
a fifth set of codes for blind decoding the plurality of codes as combined; and
a sixth set of codes for selecting another one of the plurality of hypotheses for testing in response to determining that the selected one of the plurality of hypotheses is incorrect.

34. The computer program product of claim 33, further comprising a set of codes for determining a corresponding probability for each of the plurality of hypotheses and for selecting one of the plurality of hypotheses in relation to probability.

35. The computer program product of claim 34, further comprising a set of codes for rank ordering the plurality of hypotheses according to probability.

36. The computer program product of claim 33, further comprising a set of codes for receiving a physical broadcast channel transmission across sub-frames.

37. An apparatus for decoding a channel coded transmission, comprising:
means for sequentially receiving a plurality of codes each comprising respectively a common portion and a unique portion;
means for determining a set of possible difference values for the unique portion respectively of the plurality of codes as a plurality of hypotheses, wherein each of the set of possible difference values comprises a given number of zeros followed by a given number of ones wherein the corresponding probability of each occurring having an inverse relationship to a function of base two raised to a number of bits of the selected one of the plurality of hypotheses that are ones;
means for adjusting the unique portion respectively of the plurality of codes according to a selected one of the plurality of hypotheses;
means for combining the plurality of codes as adjusted;
means for blind decoding the plurality of codes as combined; and
means for selecting another one of the plurality of hypotheses for testing in response to determining that the selected one of the plurality of hypotheses is incorrect.

38. The apparatus of claim 37, further comprising:
means for determining a corresponding probability for each of the plurality of hypotheses; and
means for selecting one of the plurality of hypotheses in relation to probability.

39. The apparatus of claim 38 further comprising means for rank ordering the plurality of hypotheses according to probability.

40. The apparatus of claim 37, further comprising means for receiving a physical broadcast channel transmission across sub-frames.

41. An apparatus for decoding a channel coded transmission, comprising:
a receiver for sequentially receiving a plurality of codes each comprising respectively a common portion and a unique portion; and
a computing platform for
determining a set of possible difference values for the unique portion respectively of the plurality of codes as a plurality of hypotheses, wherein each of the set of possible difference values comprises a given number of zeros followed by a given number of ones wherein the corresponding probability of each occurring having an inverse relationship to a function of base two raised to a number of bits of the selected one of the plurality of hypotheses that are ones,
adjusting the unique portion respectively of the plurality of codes according to a selected one of the plurality of hypotheses, combining the plurality of codes as adjusted, blind decoding the plurality of codes as combined, and selecting another one of the plurality of hypotheses for testing in response to determining that the selected one of the plurality of hypotheses is incorrect.

42. The apparatus of claim 41, wherein the computing platform is further for determining a corresponding probability for each of the plurality of hypotheses and for selecting one of the plurality of hypotheses in relation to probability.

43. The apparatus of claim 42, wherein the computing platform is further for rank ordering the plurality of hypotheses according to probability.

44. The apparatus of claim 41, wherein the receiver is further for receiving a physical broadcast channel transmission across sub-frames.

* * * * *